(12) United States Patent
Gollier

(10) Patent No.: US 7,782,913 B2
(45) Date of Patent: Aug. 24, 2010

(54) INTENSITY MODULATION IN WAVELENGTH CONVERTING OPTICAL PACKAGE

(75) Inventor: Jacques Gollier, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 359 days.

(21) Appl. No.: 11/880,289

(22) Filed: Jul. 20, 2007

(65) Prior Publication Data

US 2009/0022183 A1    Jan. 22, 2009

(51) Int. Cl.
*H01S 3/10* (2006.01)
(52) U.S. Cl. .............................. 372/20; 372/21; 372/22
(58) Field of Classification Search .............. 372/20–22
See application file for complete search history.

(56) References Cited

U.S. PATENT DOCUMENTS

| 5,073,331 | A | | 12/1991 | Shirasaki ........................ 372/26 |
| 5,936,985 | A | * | 8/1999 | Yamamoto et al. ............. 372/31 |
| 5,959,764 | A | | 9/1999 | Edagawa et al. ............ 359/326 |
| 6,028,869 | A | * | 2/2000 | Harada et al. ................. 372/19 |
| 6,490,306 | B2 | * | 12/2002 | Stamm et al. .................. 372/57 |
| 6,590,915 | B1 | | 7/2003 | Kitaoka et al. |
| 6,738,398 | B2 | | 5/2004 | Hirata et al. ................... 372/32 |
| 6,987,785 | B2 | | 1/2006 | Sakata et al. ................... 372/22 |
| 7,098,992 | B2 | | 8/2006 | Ohtsuki et al. ................. 355/69 |
| 2006/0251143 | A1 | * | 11/2006 | Volodin et al. ............... 372/102 |
| 2006/0280219 | A1 | * | 12/2006 | Shchegrov .................... 372/99 |
| 2007/0116068 | A1 | * | 5/2007 | Mao ............................. 372/10 |

FOREIGN PATENT DOCUMENTS

| EP | 0738031 | 10/1996 |
| EP | 1870973 | 12/2007 |
| WO | WO2005/091450 A1 | 9/2005 |

* cited by examiner

*Primary Examiner*—Minsun Harvey
*Assistant Examiner*—Phillip Nguyen
(74) *Attorney, Agent, or Firm*—Kwadjo Adusei-Poku

(57) ABSTRACT

Particular embodiments of the present invention relate generally to methods of controlling an optical package comprising a semiconductor laser, a spectral filter, and a wavelength conversion device. The spectral filter and the wavelength conversion device collectively define a wavelength transfer function comprising a transmission bandwidth component attributable to the spectral filter and a conversion bandwidth component attributable to the wavelength conversion device. The transmission bandwidth component of the wavelength transfer function is less than one free spectral range of the semiconductor laser. The method comprises directing the native laser output through the spectral filter and the wavelength conversion device and tuning the semiconductor laser to modulate the intensity of a wavelength-converted laser output of the optical package by shifting the native wavelength spectrum by less than one free spectral range of the semiconductor laser. Additional embodiments are disclosed and claimed.

21 Claims, 2 Drawing Sheets

INTENSITY MODULATION IN WAVELENGTH CONVERTING OPTICAL PACKAGE

BACKGROUND OF THE INVENTION

The present invention relates generally to semiconductor lasers, laser controllers, laser projection systems, and other optical systems incorporating semiconductor lasers. More particularly, the present invention relates to spectral filtering and intensity modulation in optical packages where a semiconductor laser is coupled to a wavelength conversion device.

SUMMARY OF THE INVENTION

Semiconductor lasers may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, or a Fabry-Perot laser with a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of the SHG crystal, which converts the wavelength to 530 nm.

The wavelength conversion efficiency of an SHG crystal, such as MgO-doped periodically poled lithium niobate (PPLN), is strongly dependent on the wavelength matching between the laser diode and the SHG device. As will be appreciated by those familiar with laser design, DFB lasers are resonant-cavity lasers using grids or similar structures etched into the semiconductor material as a reflective medium. DBR lasers are lasers in which the etched grating is physically separated from the electronic pumping area of the semiconductor laser. SHG crystals use second harmonic generation properties of non-linear crystals to frequency double laser radiation.

The bandwidth of a PPLN SHG device is often very small—for a typical PPLN SHG wavelength conversion device, the full width half maximum (FWHM) wavelength conversion bandwidth is only in the 0.16 to 0.2 nm range and mostly depends on the length of the crystal. Mode hopping and uncontrolled large wavelength variations within the laser cavity can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops drastically. In laser projection systems, for example, these drops in output power are particularly problematic because they can generate instantaneous changes that will be readily visible as defects at specific locations in the image. These visible defects typically manifest themselves as organized, patterned image defects across the image because the generated image is simply the signature of the temperature evolution of the different sections of the laser.

Generally, when the gain current of a semiconductor laser increases, the temperature of the gain section also increases. As a consequence, the cavity modes move towards higher wavelengths. The wavelength of the cavity modes move faster than the wavelength of the DBR section. So, the laser reaches a point where a cavity mode of lower wavelength is closer to the maximum of the DBR reflectivity curve. At that point, the mode of lower wavelength has lower loss than the mode that is established and, according to basic principles of laser physics, the laser then automatically jumps to the mode that has lower loss. Typically, the emission wavelength slowly increases and includes sudden mode hops whose amplitude is equal to one free spectral range of the laser cavity.

In many applications, it is often necessary to modulate the output intensity of optical packages incorporating semiconductor lasers. When a semiconductor laser is modulated to produce data, the thermal load varies constantly. The resulting change in laser temperature and lasing wavelength generates a variation of the efficiency of the SHG crystal. In the case of a 12 mm-long PPLN SHG device, a temperature change in the associated semiconductor laser of about 2° C. will typically be enough to take the output wavelength of the laser outside of the 0.16 nm full width half maximum (FWHM) wavelength conversion bandwidth of the crystal.

For example, and not by way of limitation, laser projection systems can be configured to generate complex projected images through pixel-by-pixel intensity variation of one or more laser-based light sources. The present inventor has recognized that the above-noted thermal signature typically persists in such packages as the intensity is modulated. In many cases, intensity modulation in a laser-based light source can exacerbate the thermal signature. The intensity modulation routines and the associated optical packages and related devices according to the present invention are contemplated herein as workable alternatives to conventional intensity modulation in laser-based light sources. Indeed, it is contemplated that the present invention can be practiced to address, manage, minimize, or otherwise control mode hopping and uncontrolled large wavelength variations within an intensity-modulated laser-based light source.

According to one embodiment of the present invention, a method of controlling an optical package comprising a semiconductor laser, a spectral filter, and a wavelength conversion device is provided. The spectral filter and the wavelength conversion device collectively define a wavelength transfer function comprising a transmission bandwidth component attributable to the spectral filter and a conversion bandwidth component attributable to the wavelength conversion device. The transmission bandwidth component of the wavelength transfer function is less than one free spectral range of the semiconductor laser. The semiconductor laser is configured to generate a native laser output comprising a native wavelength spectrum significantly broader than the transmission bandwidth component and the conversion bandwidth component of the wavelength transfer function. The method comprises directing the native laser output through the spectral filter and the wavelength conversion device and tuning the semiconductor laser to modulate the intensity of a wavelength-converted laser output of the optical package by shifting the native wavelength spectrum by less than one free spectral range of the semiconductor laser.

According to another embodiment of the present invention, the semiconductor laser is tuned to modulate the intensity of a wavelength-converted laser output of the optical package by shifting a significant portion of the native wavelength spectrum of the semiconductor laser from a band within the wavelength transfer function to a band outside of the wavelength transfer function.

According to yet another embodiment of the present invention, an optical package comprising a semiconductor laser, a spectral filter, and a wavelength conversion device is provided. The spectral filter and the wavelength conversion device collectively define a wavelength transfer function comprising a transmission bandwidth component attributable to the spectral filter and a conversion bandwidth component attributable to the wavelength conversion device. The transmission bandwidth component of the wavelength transfer function is less than one free spectral range of the semiconductor laser. The semiconductor laser comprises a wavelength-tunable laser source and is configured to generate a native laser output comprising a native wavelength spectrum that can be tuned over a range larger than the transmission bandwidth component and the conversion bandwidth component of the wavelength transfer function. The optical package is configured to direct the native laser output of the semiconductor laser through the spectral filter and the wavelength conversion device.

According to a further embodiment of the present invention, the semiconductor laser comprises a wavelength-tunable laser source that is configured to permit a significant portion of the native wavelength spectrum of the semiconductor laser to shift from a band within the wavelength transfer function to a band outside of the wavelength transfer function.

According to additional embodiments of the present invention, laser controllers programmed to operate semiconductor lasers according to the concepts of the present invention are contemplated. Laser projection systems comprising one or more semiconductor lasers and corresponding laser controllers according to the present invention are also contemplated. Although the concepts of the present invention are described primarily in the context of image forming, it is contemplated that various concepts of the present invention may also be applicable to any laser application where repeatable, low frequency fluctuation of the laser wavelength could be a problem.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
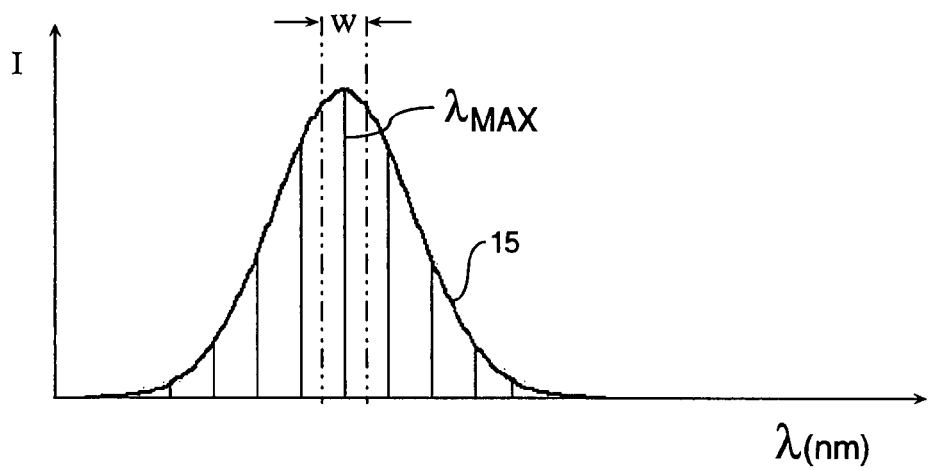
FIG. 1 is a graphical representation of a relatively broad laser output spectrum and a corresponding spectral bandwidth of a wavelength conversion device coupled to the laser.
Figure 2:
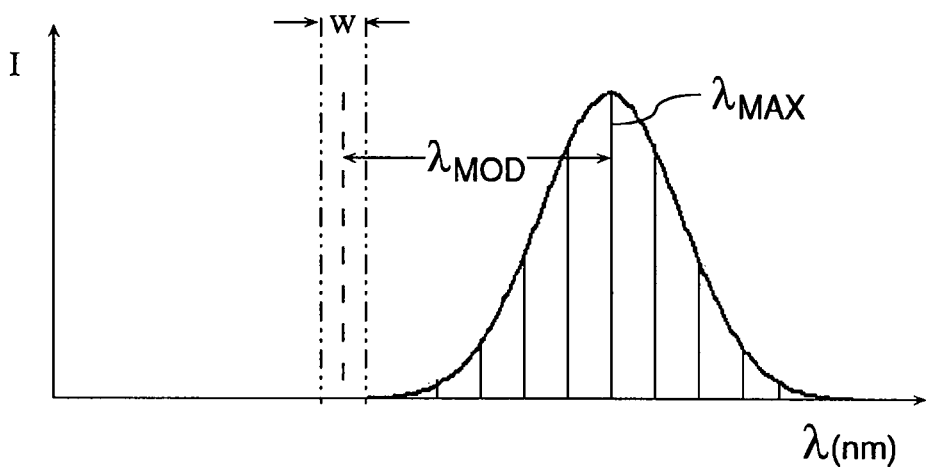
FIG. 2 is a graphical representation of a wavelength-modulated, relatively broad laser output spectrum taken relative to the corresponding spectral bandwidth illustrated in FIG. 1.
Figure 3:
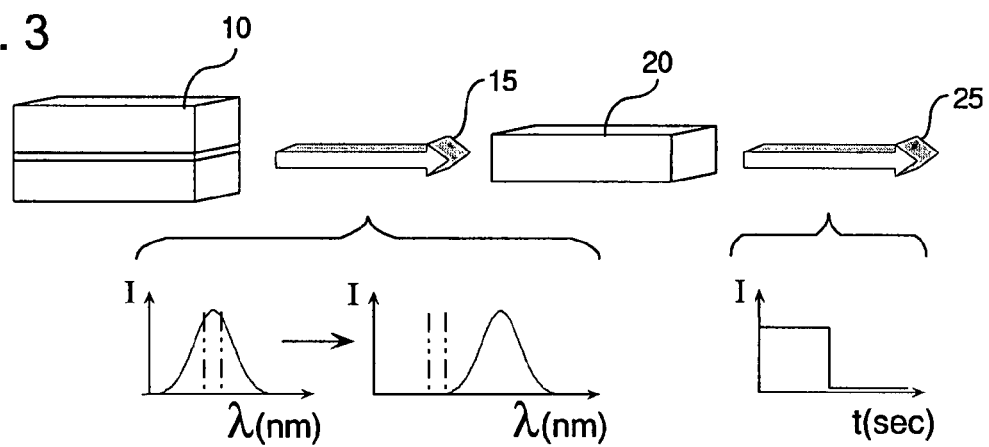
FIG. 3 is a schematic illustration of an optical package and a manner in which wavelength modulation can be used to generate an intensity-modulated optical output.

Referring initially to FIGS. 1-3, concepts of particular embodiments of the present invention may be conveniently illustrated with general reference to a semiconductor laser 10 optically coupled to a light wavelength conversion device 20. The light beam 15 emitted by the semiconductor laser 10 can be either directly coupled into the waveguide of the wavelength conversion device 20 or can be coupled through collimating and focusing optics or some other type of suitable optical element or optical system. The wavelength conversion device 20 converts the incident light into higher harmonic waves and outputs the converted signal 25. This type of configuration is particularly useful in generating shorter wavelength laser beams from longer wavelength semiconductor lasers and can be used, for example, as a green visible laser source for laser projection systems.

The intensity of the converted signal 25 can be modulated by modulating the wavelength of the semiconductor laser 10 because the wavelength conversion efficiency of the wavelength conversion device 20 is dependent on the wavelength matching between the semiconductor laser 10 and the wavelength conversion device 20. More specifically, referring to FIG. 1 where an example of a laser output spectrum is illustrated, the intensity of the converted signal 25 will be near maximum when the longitudinal mode of highest intensity $\lambda_{MAX}$ is aligned with the spectral conversion bandwidth w of the wavelength conversion device 20. In contrast, referring to FIG. 2, the intensity of the converted signal 25 will drop significantly when the laser is tuned to shift the high intensity longitudinal mode well outside of the spectral bandwidth w of the wavelength conversion device 20. This shift in lasing wavelength and the corresponding intensity drop are also illustrated schematically in FIG. 3. The degree to which the lasing wavelength is shifted to generate the aforementioned intensity drop is illustrated in FIG. 2 as the wavelength modulation $\lambda_{MOD}$. The amplitude of $\lambda_{MOD}$ is typically large enough to reach full extinction of the light beam 15. Typically, that amplitude needs to be at least two or three times the full width half maximum (FWHM) of the global spectral curve.

The present inventor has recognized that in many cases wavelength modulation of the order illustrated in FIGS. 1-3, can result in significant thermal patterning because the degree of wavelength tuning $\lambda_{MOD}$ necessary for intensity modulation can generate temperature variations that result in wavelength drift. In addition, the aforementioned wavelength tuning can also generate mode hops, particularly where the amplitude of the wavelength modulation $\lambda_{MOD}$ is larger than the laser free spectral range, as is the case in FIGS. 1 and 2. Although the present invention is not limited to any particular manifestation of the wavelength variations or sudden mode hops, these wavelength fluctuations can create smooth intensity variations and the mode hops can create relatively abrupt intensity shifts in a laser projection system. The particular pattern created in the image by these defects can be a function of a number of factors including, but not limited to, laser temperature, laser free spectral range, the PPLN crystal spectral band pass, the spectral alignment of the laser DBR with respect to the PPLN crystal, etc. Regardless of the nature of the defect pattern, the pattern itself can present a problem in the image because it presents a readily recognizable, systematic structure in the image. Also, for quasi static images, these defects typically repeat themselves from frame to frame, making it very easy to recognize the defects in the image. The present inventor has also recognized that, when the laser experiences some mode hops, the way that the modes get selected seem to follow some random rules. The consequence is that, because of the non predictable nature of mode selection, all modulation methods that involve wavelength variations with amplitudes larger than the laser free spectral range are very hard to control.

The various optical packages and associated control methods for achieving intensity modulation through wavelength tuning according to the present invention can be illustrated with reference to FIGS. 4-6, in the context of an optical package comprising a tunable semiconductor laser 10, a spectral filter 30, and a wavelength conversion device 20. Collectively, the spectral filter 30 and the wavelength conversion device 20 define a wavelength transfer function that can be conveniently illustrated in terms of a transfer function bandwidth w' because the transfer function is a combination of the transmission bandwidth of the spectral filter 30 and the conversion bandwidth component of the wavelength conversion device 20. Generally, the transfer function bandwidth w' will not extend beyond the respective bandwidth bounds defined by the wavelength conversion device 20 and the spectral filter 30. For example, when the respective bandwidths of the wavelength conversion device 20 and the spectral filter 30 are in approximate alignment with each other and are approximately equal in width, the transfer function bandwidth w' will be the same as the respective component bandwidths. When the respective bandwidths of the wavelength conversion device 20 and the spectral filter 30 are in approximate alignment with each other but have different values, the transfer function bandwidth w' will take the value of the narrower of the two bandwidth components. When the respective bandwidths of the wavelength conversion device 20 and the spectral filter 30 merely overlap, the transfer function bandwidth w' will be limited to the bandwidth of the overlap.

In practicing various embodiments of the present invention, care should be take to ensure at least some degree of overlap between the component bandwidths of the wavelength conversion device 20 and the spectral filter 30 because, where there is no overlap, the optical package will not transmit a significant converted laser output. For example, and not by way of limitation, where the spectral filter 30 comprises a Fabry-Perot filter and the wavelength conversion device 20 comprises a PPLN SHG crystal, the transmission bandwidth of the spectral filter 30 can be less than 0.06 and the conversion bandwidth of the crystal 20 can be 0.06 nm, 0.1 nm, 0.2 nm or less. In this example, the transfer function bandwidth w' would be less than or equal to 0.06 nm.

Figure 4:
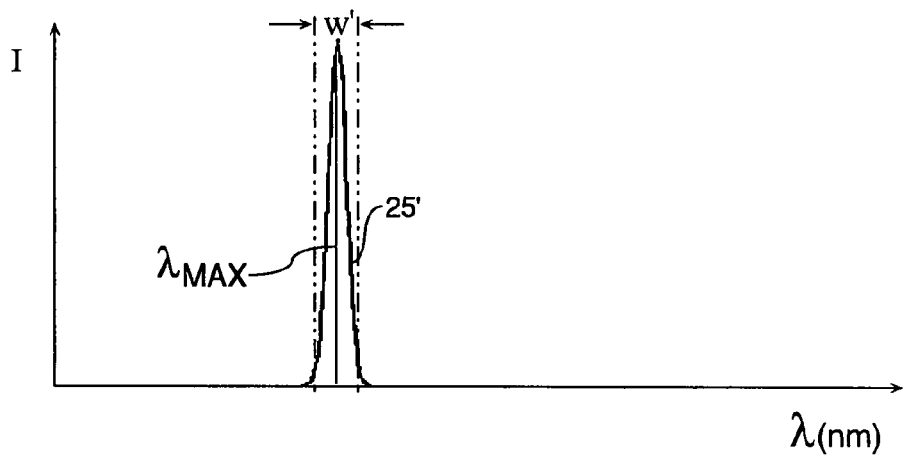
FIG. 4 is a graphical representation of a relatively narrow wavelength transfer function defined by the combination of a filtered laser output spectrum and a wavelength conversion device according to one embodiment of the present invention.

As is illustrated in FIG. 4, the intensity of the converted signal 25' generated at the output of the wavelength conversion device 20 will be near maximum when the longitudinal mode of highest intensity $\lambda_{MAX}$ is aligned with the center of the transfer function bandwidth w' of the wavelength conversion device 20. In contrast, referring to FIG. 5, the intensity of the converted signal 25' will drop significantly when the laser is tuned to shift the high intensity longitudinal mode $\lambda_{MAX}$ outside of the transfer function bandwidth w' of the wavelength conversion device 20. This shift in lasing wavelength and the corresponding intensity drop are also illustrated schematically in FIG. 6. Typically, the semiconductor laser 10 is configured to generate a native IR or near-IR laser output 15 and the wavelength conversion device 20 is configured to generate a wavelength-converted blue or green laser output 25'.

Figure 5:
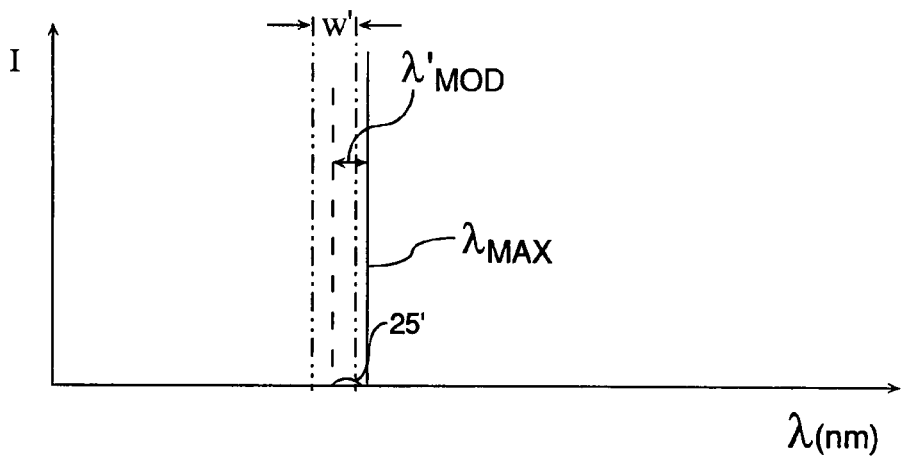
FIG. 5 is a graphical representation of a degree of wavelength modulation suitable for intensity modulation in the context of the relatively narrow wavelength transfer function illustrated in FIG. 4.

The degree to which the lasing wavelength is shifted to generate the aforementioned intensity drop is illustrated in FIG. 5 as the wavelength modulation $\lambda'_{MOD}$ and is significantly smaller in magnitude than the corresponding wavelength modulation $\lambda_{MOD}$ illustrated in FIGS. 2-3, where no spectral filter is provided. As a result, relatively small magnitude wavelength modulation can be employed to generate significant intensity modulation in the converted signal 25' by providing the spectral filter 30 and configuring the optical package such that the transmission bandwidth of the spectral filter 30 is a component of the wavelength transfer function. Further, by configuring the optical package such that the transmission bandwidth component of the spectral filter is less than one free spectral range of the semiconductor laser, those practicing the present invention can address, manage, minimize, or otherwise control mode hopping and uncontrolled large wavelength variations within the intensity-modulated laser-based light source.

In operation, the semiconductor laser 10 generates a native laser output 15 comprising a native wavelength spectrum that is significantly broader than the transmission bandwidth and conversion bandwidth components of the wavelength transfer function, similar to that which is illustrated in FIGS. 1 and 2. However, as is illustrated in FIGS. 4-6, the relatively broad native laser output 15 is directed through the spectral filter 30 and the wavelength conversion device 20 and the semiconductor laser 10 is tuned over the relatively narrow wavelength modulation $\lambda'_{MOD}$ illustrated in FIG. 5. According to this modulation scheme, shifts in the native wavelength spectrum of less than one free spectral range of the semiconductor laser are sufficient to modulate the intensity of the wavelength-converted laser output 25' of the optical package. Given the relatively large breadth of the native laser output 15, it is typically sufficient to merely shift a portion of the native wavelength spectrum of the semiconductor laser 10 from within the transfer function bandwidth w' to a band outside of the transfer function bandwidth w', as is illustrated in FIG. 5.

Typically, the semiconductor laser can be intensity-modulated by shifting the native wavelength spectrum 15 of the semiconductor laser 10 by an amount that is less than the transmission bandwidth component attributable to the spectral filter 30. For example, and not by way of limitation, where the transmission bandwidth component of the spectral filter is less than 0.06 nm, intensity modulation can be achieved by shifting the native wavelength spectrum of the semiconductor laser by less than approximately 0.06 nm. Noting that a component of the wavelength transfer function is also attributable to the wavelength conversion device 20, it is also contemplated that the semiconductor laser can be intensity-modulated by shifting the native wavelength spectrum 15 of the semiconductor laser 10 by an amount that is less than the conversion bandwidth component attributable to the wavelength conversion device 20. For example, and not by way of limitation, where the conversion bandwidth component of the wavelength transfer function is less than approximately 0.2 nm, intensity modulation can be achieved by shifting the native wavelength spectrum of the semiconductor laser by less than approximately 0.06 nm. Given the fact that spectral filters and wavelength conversion devices are contemplated with significantly more narrow bandwidths, it is contemplated that wavelength shifts well below 0.1 nm, i.e., on the order of 0.01 nm, may be employed to achieve intensity modulation in wavelength converting optical packages.

In particular embodiments of the present invention, the semiconductor laser 10 comprises a DBR laser and the wavelength is shifted by applying electrical current to the phase section of the DBR laser. In other embodiments of the present invention, the semiconductor laser 10 comprises a DBR laser and the wavelength is shifted by applying electrical current to the phase section and the DBR section of the laser to prevent mode hops in the semiconductor laser. In further embodiments of the present invention, the semiconductor laser 10 comprises a DBR laser and the wavelength is shifted by applying a reverse voltage to the phase section of the semiconductor laser 10 to prevent thermal drifts.

Figure 6:
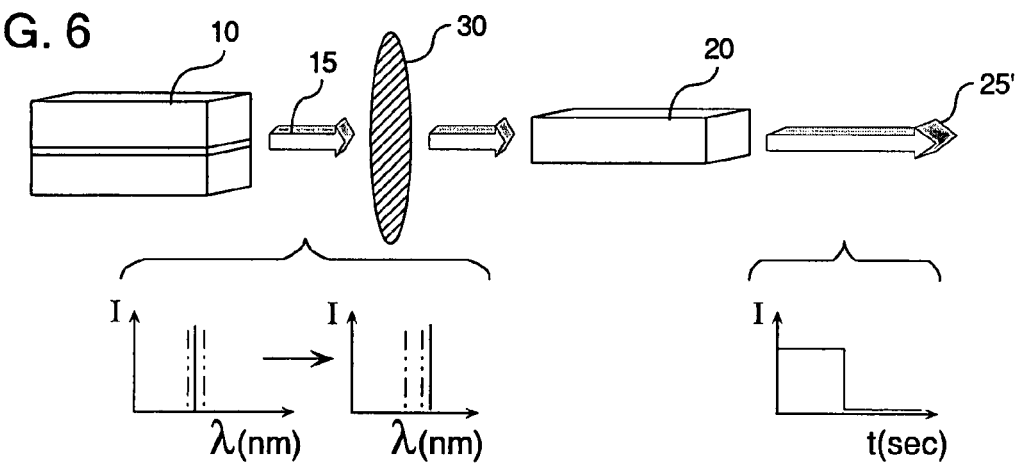
FIG. 6 is a schematic illustration of an optical package according to one embodiment of the present invention defining a relatively narrow wavelength transfer function and a manner in which wavelength modulation can be used to generate an intensity-modulated optical output.

Although FIG. 6 illustrates the spectral filter 30 being upstream of the wavelength conversion device 20, it is contemplated that the native laser output 15 can be directed through the spectral filter 30 prior to, or after being directed through the wavelength conversion device 20, or both. Regarding the selection and configuration of the spectral filter 30 and the wavelength conversion device 20, it is noted that it will often be more convenient to configure the optical package such that the transmission bandwidth component attributable to the spectral filter 30 is less than or equal to the conversion bandwidth component attributable to the wavelength conversion device 20.

It is contemplated that the concepts of the present invention may be employed in a variety of laser-based light sources including those used in pixel-based projection systems, spatial light modulator based systems (including digital light processing (DLP), transmissive LCD, and liquid crystal on silicon (LCOS)), etc. It is also contemplated that optical packages may be configured to embody particular aspects of the present invention by providing such packages with laser controllers programmed to shift the native wavelength spectrum of a semiconductor laser to intensity modulate a wavelength converted output of the optical package in the manner described herein.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "approximately" is utilized herein to represent the inherent degree of uncertainty that may be attributed to any quantitative comparison, value, measurement, or other representation.

What is claimed is:

1. A method of controlling an optical package comprising a semiconductor laser, a spectral filter, and a wavelength conversion device, wherein:
   the spectral filter and the wavelength conversion device collectively define a wavelength transfer function comprising a transmission bandwidth component attributable to the spectral filter and a conversion bandwidth component attributable to the wavelength conversion device;
   the transmission bandwidth component attributable to the spectral filter is less than one free spectral range of the semiconductor laser;
   the semiconductor laser is configured to generate a native laser output comprising a native wavelength spectrum that can be tuned over a range equal to or larger than the transmission bandwidth component attributable to the spectral filter and the conversion bandwidth component attributable to the wavelength conversion device; and
   the method comprises directing the native laser output through the spectral filter and the wavelength conversion device and tuning the semiconductor laser to modulate the intensity of a wavelength-converted laser output of the optical package by shifting the native wavelength spectrum by less than one free spectral range of the semiconductor laser.

2. A method of controlling an optical package comprising a semiconductor laser, a spectral filter, and a wavelength conversion device, wherein:
   the spectral filter and the wavelength conversion device collectively define a wavelength transfer function comprising a transmission bandwidth component attributable to the spectral filter and a conversion bandwidth component attributable to the wavelength conversion device;
   the semiconductor laser is configured to generate a native laser output comprising a native wavelength spectrum significantly broader than transmission bandwidth component attributable to the spectral filter and the conversion bandwidth component attributable to the wavelength conversion device; and
   the method comprises directing the native laser output through the spectral filter and the wavelength conversion device and tuning the semiconductor laser to modulate the intensity of a wavelength-converted laser output of the optical package by shifting a significant portion of the native wavelength spectrum of the semiconductor laser from a band within the wavelength transfer function to a band outside of the wavelength transfer function.

3. A method as claimed in claim 2 wherein the transmission bandwidth component attributable to the spectral filter is less than one free spectral range of the semiconductor laser and the semiconductor laser is tuned by shifting the native wavelength spectrum by less than one free spectral range of the semiconductor laser.

4. A method as claimed in claim 2 wherein the semiconductor laser is tuned by shifting the native wavelength spectrum of the semiconductor laser by an amount that is less than the transmission bandwidth component attributable to the spectral filter.

5. A method as claimed in claim 4 wherein the transmission bandwidth component attributable to the spectral filter is less than approximately 0.06 nm and the semiconductor laser is tuned by shifting the native wavelength spectrum of the semiconductor laser by less than approximately 0.06 nm.

6. A method as claimed in claim 2 wherein the semiconductor laser is tuned by shifting the native wavelength spectrum of the semiconductor laser by an amount that is less than the conversion bandwidth component attributable to the wavelength conversion device.

7. A method as claimed in claim 6 wherein the semiconductor laser is tuned by shifting the native wavelength spectrum of the semiconductor laser by less than approximately 0.06 nm.

8. A method as claimed in claim 2 wherein the semiconductor laser comprises a DBR laser and the wavelength is shifted by applying electrical current to the phase section of the DBR laser.

9. A method as claimed in claim 2 wherein the semiconductor laser comprises a DBR laser and the wavelength is shifted by applying electrical current to the phase section and the DBR section of the laser to prevent mode hops in the semiconductor laser.

10. A method as claimed in claim 2 wherein the semiconductor laser comprises a DBR laser and the wavelength is shifted by applying a reverse voltage to the phase section of the semiconductor laser to prevent thermal drifts.

11. A method as claimed in claim 2 wherein the native laser output is directed through the spectral filter prior to being directed through the wavelength conversion device.

12. A method as claimed in claim 2 wherein the native laser output is directed through the wavelength conversion device prior to being directed through the spectral filter.

13. A method as claimed in claim 2 wherein the spectral filter comprises a Fabry-Perot filter.

14. A method as claimed in claim 2 wherein the wavelength conversion device comprises an SHG crystal.

15. A method as claimed in claim 2 wherein the semiconductor laser is configured to generate a native IR or near-IR laser output and the wavelength conversion device is configured to generate a wavelength-converted blue or green laser output.

16. A method as claimed in claim 2 wherein the transmission bandwidth component attributable to the spectral filter is less than or approximately equal to the conversion bandwidth component attributable to the wavelength conversion device.

17. An optical package comprising a semiconductor laser, a spectral filter, and a wavelength conversion device, wherein:
the spectral filter and the wavelength conversion device collectively define a wavelength transfer function comprising a transmission bandwidth component attributable to the spectral filter and a conversion bandwidth component attributable to the wavelength conversion device;
the transmission bandwidth component attributable to the spectral filter is less than one free spectral range of the semiconductor laser;
the semiconductor laser comprises a wavelength-tunable laser source and is configured to generate a native laser output comprising a native wavelength spectrum significantly broader than the transmission bandwidth component attributable to the spectral filter and the conversion bandwidth component attributable to the wavelength conversion device ; and
the optical package is configured to direct the native laser output of the semiconductor laser through the spectral filter and the wavelength conversion device.

18. A method as claimed in claim 16 wherein the optical package is part of a visible light source and is comprised within a laser projection system.

19. A method as claimed in claim 16 wherein the optical package further comprises a laser controller programmed to shift the native wavelength spectrum of the semiconductor laser.

20. An optical package comprising a semiconductor laser, a spectral filter, and a wavelength conversion device, wherein:
the spectral filter and the wavelength conversion device collectively define a wavelength transfer function comprising a transmission bandwidth component attributable to the spectral filter and a conversion bandwidth component attributable to the wavelength conversion device;
the semiconductor laser is configured to generate a native laser output comprising a native wavelength spectrum significantly broader than the transmission bandwidth component attributable to the spectral filter and the conversion bandwidth component attributable to the wavelength conversion device;
the optical package is configured to direct the native laser output of the semiconductor laser through the spectral filter and the wavelength conversion device; and
the semiconductor laser comprises a wavelength-tunable laser source configured to permit a significant portion of the native wavelength spectrum of the semiconductor laser to shift from a band within the wavelength transfer function to a band outside of the wavelength transfer function.

21. An optical package as claimed in claim 20 wherein:
the transmission bandwidth component attributable to the spectral filter is less than one free spectral range of the semiconductor laser; and
the optical package further comprises a laser controller programmed to intensity modulate a wavelength converted output of the optical package by shifting the native wavelength spectrum by less than one free spectral range of the semiconductor laser.

* * * * *